US006765296B2

(12) United States Patent
Park et al.

(10) Patent No.: US 6,765,296 B2
(45) Date of Patent: Jul. 20, 2004

(54) VIA-SEA LAYOUT INTEGRATED CIRCUITS

(75) Inventors: Jae Soo Park, Singapore (SG); Chivukula Subramanyam, Singapore (SG); Thow Phock Chua, Singapore (SG); Hong Lim Lee, Malaysia (MY)

(73) Assignee: Chartered Semiconductor Manufacturing Ltd., Singapore (SG)

( * ) Notice: Subject to any disclaimer, the term of this patent is extended or adjusted under 35 U.S.C. 154(b) by 17 days.

(21) Appl. No.: 10/044,344

(22) Filed: Jan. 10, 2002

(65) Prior Publication Data

US 2003/0127739 A1 Jul. 10, 2003

(51) Int. Cl.⁷ ............................................... H01L 23/48
(52) U.S. Cl. ................... 257/758; 257/700; 257/701; 257/774; 257/775; 257/776; 257/786; 257/784; 257/207; 257/211; 257/208; 257/210; 257/797
(58) Field of Search ................................ 257/758, 700, 257/701, 786, 774–776, 784, 680, 207–211, 797

(56) References Cited

U.S. PATENT DOCUMENTS

| 5,689,139 A | * | 11/1997 | Bui et al. ..................... 257/758 |
| 6,140,693 A | * | 10/2000 | Weng et al. .................. 257/532 |
| 6,163,074 A | * | 12/2000 | Lee et al. ..................... 257/734 |
| 6,232,662 B1 | * | 5/2001 | Saran .......................... 257/750 |
| 6,245,658 B1 | * | 6/2001 | Buynoski ..................... 438/619 |
| 6,297,537 B1 | * | 10/2001 | Saito ........................... 257/390 |
| 6,417,087 B1 | * | 7/2002 | Chittipeddi et al. ......... 438/612 |
| 6,458,686 B1 | * | 10/2002 | Piao ............................ 438/622 |
| 6,468,894 B1 | * | 10/2002 | Yang et al. .................. 438/622 |
| 2003/0015772 A1 | * | 1/2003 | Ivanov et al. ............... 257/659 |
| 2003/0036293 A1 | * | 2/2003 | Tanaka et al. .............. 438/780 |

* cited by examiner

Primary Examiner—Alexander Oscar Williams
(74) Attorney, Agent, or Firm—Mikio Ishimaru

(57) ABSTRACT

An integrated circuit interconnect is provided having a dielectric layer disposed between a wide top metal line and a wide bottom metal line. A via-sea in the dielectric layer connects the wide top and wide bottom metal lines by means of a first via having a width, a second via having a width and spaced more than two widths away and less than four widths away from the first via.

14 Claims, 1 Drawing Sheet

VIA-SEA LAYOUT INTEGRATED CIRCUITS

TECHNICAL FIELD

The present invention relates generally to vias in integrated circuits and more particularly to the via-sea connecting wide bottom metal and top metal conductors in integrated circuits.

BACKGROUND ART

In integrated circuits, interconnect structures generally take the form of patterned metalization lines, or wires, that are used to electrically interconnect individual semiconductor devices to external circuitry. The individual devices may include complimentary metal oxide semiconductor (CMOS) transistors and a single integrated circuit chip may include thousands or millions of such devices. These devices are powered by a power strip, or power line which is one of the top layers of an integrated circuit.

Generally, the devices are formed on a semiconductor substrate in a silicon wafer and then covered by a dielectric layer of a material such as silicon dioxide. Contacts are formed through the dielectric layer using photolithographic processes which include depositing a photoresist layer over the dielectric layer, selectively exposing the photoresist to light through a patterned reticle having contact hole patterns, developing the photoresist to form a photoresist contact mask, and etching the exposed dielectric layer to form the contact holes that lead to the devices. Once the contact holes are formed, a conductive material, such as tungsten, is used to fill the contact holes to form "tungsten plugs". Additional dielectric layers are then deposited and similar photolithographic processes are used to form metalization layers and vias, which interconnect the metalization layers.

While contacts and vias in the lower levels form individual connections between the various metal lines, it has been found that a plurality of vias are required to connect to the power line. However, metal explosions, or metal voids, starting from the bottom of the vias extending upwards toward the top power line have been discovered. These metal explosions reduce the power carrying capability of the power lines and adversely affect the performance of the devices in the integrated circuit.

The reasons for this problem are poorly understood and a solution has long been sought but has equally long eluded those skilled in the art.

DISCLOSURE OF THE INVENTION

The present invention provides an integrated circuit interconnect having a wide top metal line and a wide bottom metal line. A dielectric layer is disposed between the wide top and wide bottom metal lines. A via-sea, including a first via having a width and a second via having a width and spaced more than a width away and less than four widths away from the first via in the dielectric layer, connects the wide top and wide bottom metal lines. The width and spacing of the vias reduce the occurrence of metal explosions which are known to reduce the power carrying capability of the power lines and adversely affect the performance of the devices in the integrated circuit.

The above and additional advantages of the present invention will become apparent to those skilled in the art from a reading of the following detailed description when taken in conjunction with the accompanying drawings.

BEST MODE FOR CARRYING OUT THE INVENTION

Figure 1:
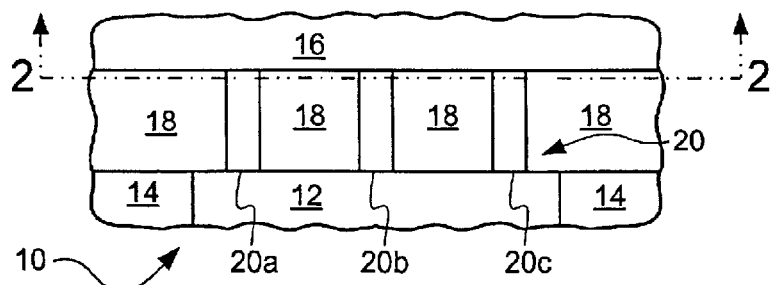
FIG. 1 is a cross-section of a portion of an integrated circuit showing the via-sea.

Referring now to FIG. 1, therein is shown a cross-section 10 of a portion of an integrated circuit interconnect in an integrated circuit (not shown). The cross-section 10 contains a wide bottom metal line 12 disposed in a dielectric 14. The wide bottom metal line 12 is vertically separated from a wide top metal line 16 by a dielectric layer 18. The wide bottom metal line 12 and the wide top metal line 16 are perpendicular to each other with the wide top metal line 16 having a length from right to left in FIG. 1.

The term "wide" is used because these metal lines are much wider than the metal lines used to interconnect individual devices. The term "vertical" or "horizontal" as used in herein is defined as in a plane respectively perpendicular or parallel to the conventional plane or surface of a wafer, regardless of the orientation of the wafer.

A via-sea 20 is disposed in the dielectric layer 18 and consists of individual vias 20a, 20b, and 20c.

Figure 2:
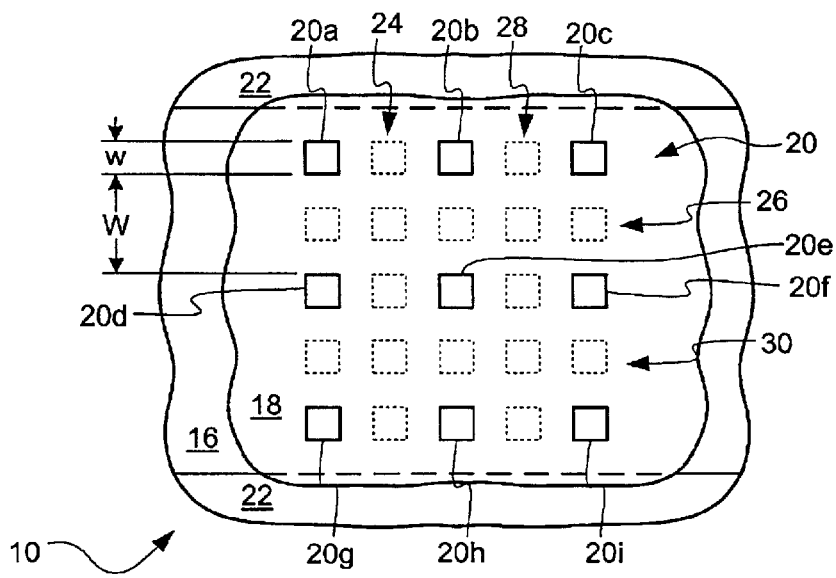
FIG. 2 is a cross-section of FIG. 1 taken along line 2—2 of one embodiment of the present invention.

Referring now to FIG. 2, therein is shown a cross-sectional view of FIG. 1 along line 2—2 looking up towards the wide top metal line 16 which is embedded in a dielectric layer 22. The via-sea 20 is shown more fully as vias 20a through 20i. The vias 20a through 20i are squares having a width "w" and spaced equal distances "W" apart. The distances that the vias are apart, such as the via 20a from the via 20d, would be such that "W" is slightly larger than two widths "w" and up to four times greater than width "w".

As may be seen in FIG. 2, in one embodiment "W" is sufficiently large so that a column of additional vias 24, indicated by the dotted lines, could be inserted between the via 20a and the via 20b while a row 26 could be inserted between the vias 20a and 20d. Thus, for the three-by-three via array having the vias 20a through 20i, the vias could be separated by columns 24 and 28 and rows 26 and 30.

It would be understood that these rows and columns are not present in the present invention.

Figure 3:
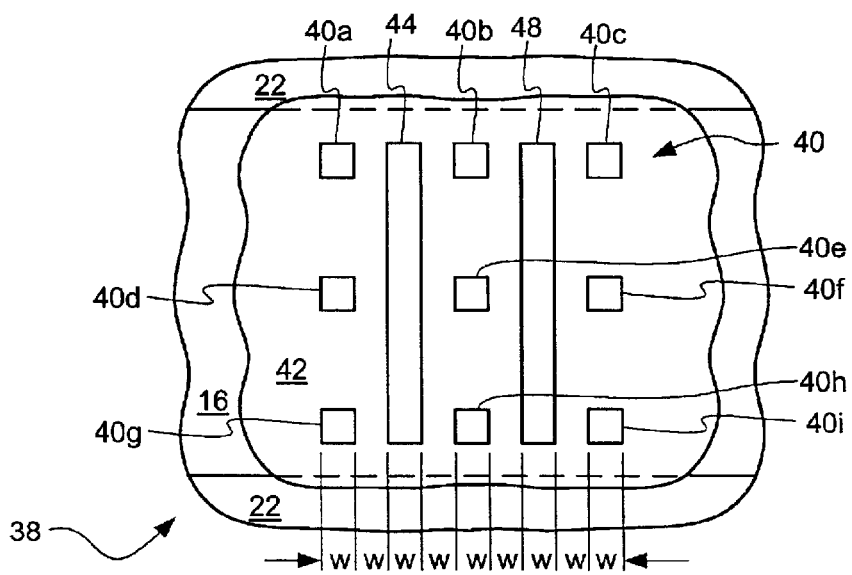
FIG. 3 is a cross-section similar to FIG. 2 of another embodiment of the present invention.

Referring now to FIG. 3, therein is shown a cross-section 38 similar to the cross-section 10 of FIG. 2. In FIG. 3, the wide top metal line 16 is shown disposed in a dielectric layer 22. A via dielectric layer 42 is shown under the wide top metal line 16 and the dielectric layer 22.

Vias 40a through 40i are formed in a similar fashion to the vias 20a through 20i.

The via dielectric layer 42 has two rectangular openings 44 and 48 formed therein respectively between the vias 40a and 40b and the vias 40b and 40c. In one embodiment, the openings 44 and 48 are the same width "w" as each of the vias 40a through 40i and are further spaced apart a distance "w" from the vias. The rectangular openings 44 and 48 extend the width of the via-sea 40.

After discovery of the metal explosion in the vias in the areas adjacent to the wide metal lines 12 and 16, a study was conducted to determine the root cause of the problem. However, the actual cause can not be determined. After extensive analysis, it is suspected that the root causes of metal explosion are:

1) mismatch in thermal expansion among the metal/via/dielectric materials;
2) adhesion difference between the metal and the via, and the metal and the dielectric; and/or 3) a driving force due to a localized stress gradient, which creates high stress on the localized area at the boundary of the dielectric and metal.

It has been unexpectedly discovered that leaving the equivalent of one set of rows and columns out from the via-sea as shown in FIG. 2 or removing the equivalent of rows and inserting a column opening in the via dielectric layer will eliminate metal explosion.

It will be understood by those skilled in the art, that as vias become smaller and smaller, the vias which are squares in the photolithographic mask become distorted and form rectangles or circles, and the widths become lengths or diameters.

The above invention has provided additional process margin (increased thermal budgets, film stress, and adhesion margin) and has provided better product reliability.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations which fall within the spirit and scope of the included claims. All matters set forth herein or shown in the accompanying drawings are to be interpreted in an illustrative and non-limiting sense.

The invention claimed is:

1. An integrated circuit interconnect comprising:
   a wide top metal line;
   a wide bottom metal line;
   a dielectric layer disposed between the wide top and wide bottom metal lines;
   a plurality of vias in the dielectric layer and connecting the wide top and wide bottom metal lines including:
      a first via having a width, and
      a second via having a width and spaced more than two widths away and less than four widths away from the first via with no intervening vias.

2. The integrated circuit as claimed in claim 1 wherein:
   the second via is spaced from the first via in a direction perpendicular to the length of the wide top metal line; and including:
      a third via having a width and spaced more than two widths and less than four widths from the first via in a direction parallel to the length of the wide top metal line.

3. The integrated circuit as claimed in claim 1 wherein:
   the second via is spaced from the first via in a direction parallel to the length of the wide top metal line; and including:
      a third via having a width and spaced more than two widths and less than four widths from the first via in a direction perpendicular to the wide top metal line.

4. The integrated circuit as claimed in claim 1 wherein:
   the dielectric layer has an opening provided therein equidistant from the first and second vias.

5. The integrated circuit as claimed in claim 4 wherein:
   the opening which has a width equal to the width of the first via.

6. The integrated circuit as claimed in claim 4 wherein:
   the opening has a length greater than twice the width thereof.

7. The integrated circuit as claimed in claim 4 wherein:
   the opening has a length and the length extends perpendicular to the length of the wide top metal line.

8. An integrated circuit interconnect comprising:
   a wide top metal line;
   a wide bottom metal line;
   a dielectric layer disposed between the wide top and wide bottom metal lines; and
   a via-sea in the dielectric layer and connecting the wide top and wide bottom metal lines including:
      a first column of vias having a width, and
      a second column of visa having a width and spaced more than two widths away and less than four widths away from the first column of vias with no intervening vias.

9. The integrated circuit as claimed in claim 8 wherein:
   the second column of visa is spaced from the first column of visa in a direction perpendicular to the length of the wide top metal line; and including:
      a first row of visa including a via in the first column of vias having a width and spaced more than two widths and less than four widths from the first column of visa in a direction parallel to the wide top metal line.

10. The integrated circuit as claimed in claim 8 wherein:
    the second column of visa is spaced from the first column of vias in a direction parallel to the length of the wide top metal line; and including:
       a first row of vias including a via in the first column of vias having a width and spaced more than two widths and less than four widths from the first column of vias in a direction perpendicular to the wide top metal line.

11. The integrated circuit as claimed in claim 8 wherein:
    the dielectric layer has an opening provided therein equidistant from the first column of vias and the second column of vias.

12. The integrated circuit as claimed in claim 11 wherein:
    the opening has a width equal to the width of the first column of vias.

13. The integrated circuit as claimed in claim 11 wherein:
    the opening has a length greater than twice the width thereof.

14. The integrated circuit as claimed in claim 11 wherein:
    the opening has a length and extends perpendicular to the length of the wide cop metal line.

* * * * *

UNITED STATES PATENT AND TRADEMARK OFFICE
CERTIFICATE OF CORRECTION

PATENT NO. : 6,765,296 B2
DATED : July 20, 2004
INVENTOR(S) : Park et al.

It is certified that error appears in the above-identified patent and that said Letters Patent is hereby corrected as shown below:

Column 4,
Lines 20, 25, 26, 28, 31 and 33, delete "visa" and insert therefore -- vias --
Line 54, delete "cop" and insert therefore -- top --

Signed and Sealed this

First Day of March, 2005

JON W. DUDAS
*Director of the United States Patent and Trademark Office*